(12) United States Patent
Jeng

(10) Patent No.: US 6,177,695 B1
(45) Date of Patent: Jan. 23, 2001

(54) DRAM USING OXIDE PLUG IN BITLINE CONTACTS DURING FABRICATION

(75) Inventor: Erik S. Jeng, Hsinchu (TW)

(73) Assignee: Vanguard International Semiconductor Corporation (TW)

( * ) Notice: Under 35 U.S.C. 154(b), the term of this patent shall be extended for 0 days.

(21) Appl. No.: 09/414,099

(22) Filed: Oct. 7, 1999

(30) Foreign Application Priority Data

Dec. 21, 1998 (TW) ................................................ 87121345

(51) Int. Cl.⁷ .......................... H01L 27/108; H01L 29/76; H01L 21/8234; H01L 21/20
(52) U.S. Cl. .......................... 257/296; 257/303; 257/309; 438/255; 438/398
(58) Field of Search ..................................... 438/398, 396, 438/399, 397, 238, 240, 255; 257/296, 302, 303, 309, 310

(56) References Cited

U.S. PATENT DOCUMENTS

| | | | |
|---|---|---|---|
| 5,120,674 | 6/1992 | Chin et al. ............................ | 537/52 |
| 5,214,603 | 5/1993 | Dhong et al. ........................ | 365/207 |
| 5,387,533 | 2/1995 | Kim ..................................... | 437/52 |
| 5,578,850 | 11/1996 | Fitch et al. .......................... | 257/329 |
| 5,629,539 | * 5/1997 | Aoki et al. .......................... | 257/306 |
| 5,665,626 | * 9/1997 | Cronin ................................. | 438/396 |
| 5,736,761 | 4/1998 | Risch et al. .......................... | 257/301 |

* cited by examiner

Primary Examiner—Matthew Smith
Assistant Examiner—Lex H. Malsawma
(74) Attorney, Agent, or Firm—Wood, Herron & Evans, L.L.P.

(57) ABSTRACT

The conventional capacitor-under-bitline (CUB) DRAM structure faces problems of high photoresist developing aspect ratio and step-height. The present invention discloses a DRAM with planar upper-plate structure and the upper-plate forms an opening broader than the bitline contacts at the top of the lower-plate neighboring the bitline contacts to isolate from the bitline contacts, and the step height at the interface between the peripheral circuit and cell arrays almost does not exist. Furthermore, conventional problems could be solved because of an oxide plug during producing bitline contacts and the thick oxide deposited on the peripheral circuit. A lightly doped polysilicon is deposited between the lower-plate and the silicon wafer substrate to avoid current leakage of the lower-plate.

8 Claims, 5 Drawing Sheets

DRAM USING OXIDE PLUG IN BITLINE CONTACTS DURING FABRICATION

BACKGROUND OF THE INVENTION

1. Field of Invention

The present invention relates to a dynamic random access memory made to have high integration density and low critical dimension and the method for making the same, and more specifically relates to a dynamic random access memory with planar upper-plate, low photoresist aspect ratio of bitline contacts, and low step height between periphery and cell arrays and method for making the same.

2. Description of the Related Art

The DRAM technology develops rapidly. The utilization and markets of DRAM further push the development of science and technology. The MOSFET IC (Metal-Oxide-Semiconductor Field-Effect-Transistor Integrated Circuit) is one of the main integrated circuit products. The production method basically comprises the steps of forming an insulated field oxide on silicon wafer and then producing a field-effect-transistor on the silicon wafer. In order to reduce the cost, the issue for increasing memory chip numbers per unit of wafer area and reducing memory chip area is more important. The decreasing of critical dimension becomes a greater challenge. The difficulties in the process, for example, spectrometric effects and molecular chemistry effects, are increasing because of the decreasing of critical dimension, for instance, from 0.25 $\mu$m to 0.19 $\mu$m.

The manufacturing of the metal contact has not influenced the whole DRAM production process until the pattern dimension decreases. The surface area of the capacitor and capacitance must be enhanced under the limited surface area as the integration density increases. In order to attain enough capacitance and excellent performance under the limited planar surface area, the three-dimensional structures are practical solutions. However, the three-dimensional structures, for example, the vertical and stacked capacitor, will result in difficulties during producing processes. The increasing step height and aspect ratio not only challenge producing processes, but also result in variations of critical dimension, and will influence throughput and yield. In order to solve such problems, various ways have been proposed to produce high integration density memory under the limited space. For example, U.S. Pat. No. 5,120,674 has disclosed a method of making a stacked capacitor DRAM cell; U.S. Pat. No. 5,214,603 has disclosed a folded bitline, ultra-high density DRAM having access transistors stacked above trench storage capacitors; U.S. Pat. No. 5,578,850 has disclosed a vertically oriented DRAM structure which replaces the conventional planar transistors; U.S. Pat. No. 5,387,533 has disclosed a method of making DRAM which has a dual cell plate structure made by forming two field insulation films with a constant interval on a semiconductor substrate and forming word lines uniformly spaced from each other along with the associated bit lines; U.S. Pat. No. 5,736,761 has disclosed a DRAM cell arrangement and method for manufacturing it, which can be utilized in 1 Gbit generation.

Conventional methods of upper-plate etching in capacitor-under-bitline DRAM (CUB DRAM) are facing patterning challenges on critical dimension control, misaligneton high step height. In order to overcome the upper-plate patterning difficulties, many techniques, such as thin resist and multiple exposure, were proposed for the plate formation. However, much more difficult was found in the plate etching while step height increases rapidly. As shown in FIG. 1, for a structure of the conventional capacitor-under-bitline DRAM, high step height and high photoresist aspect ratio are critical issues to be solved. In order to gain the capacitance and surface formed by the hemi-sphere grain and high dielectric constant substance 91, the three-dimensional structures cause the height differences deposited by the upper-plate 13 to be almost 1 $\mu$m, especially at the interface between peripheral circuit and cell arrays. The thickness of the following photoresist coating should be about 1 $\mu$m in order to make the masked photoresist area 12 resist etching of the following process. In consequence, the depth of the unmasked photoresist area 11 almost reaches 2 $\mu$m. Such high photoresist aspect ratio of contact makes the exposure and development of the bitline contacts almost impossible, especially when the integration density of the contact increases and the critical dimension of the contact decreases, for example, 0.25 $\mu$m. The exposure light and developer is hard to reach the bottom of the bitline contacts, and thus proceeding processes will be influenced.

SUMMARY OF THE INVENTION

An object of the present invention is to provide a novel and practical DRAM which effectively decreases the photoresist aspect ratio during producing bitline contacts and further obtains clear and precise patterns of the bitline contacts in confined linewidth and thus increases integration density of the memory.

Another object of the present invention is to decrease the step height at the interface between peripheral circuit and cell arrays. The poor coating problem occurring at peripheral circuit because of high step height could be solved. Furthermore, there is a lightly doped polysilicon layer between the lower-plate and the silicon wafer substrate. The lightly doped polysilicon layer prevents the lower-plate from current leakage, large energy consumption and signal interruption.

A further object of the present invention is to provide a novel and practical method for making DRAM. The processes for making the capacitor and bitline contacts could avoid the disadvantages mentioned hereinbefore.

A still further object of the present invention is to provide a novel and practical method for making DRAM by which the current leakage would not occur between the lower-plate and the silicon wafer substrate.

To achieve the objects mentioned above, the present invention discloses a novel DRAM which has a planar upper-plate. Furthermore, the upper-plate of the DRAM has an opening broader than the contact at the top of the lower-plate neighboring the bitline contacts. And, the step height at the interface between the peripheral circuit and cell arrays almost does not exist.

To achieve the objects mentioned above, the present invention discloses a novel method for making DRAM. In the method, an oxide plug is formed at bitline contacts when producing the capacitor-under-bitline DRAM. Furthermore, the upper-plate of the DRAM forms a broader opening than the contact at the top of the lower-plate neighboring the bitline contacts in order to decrease the photoresist aspect ratio and to release the critical requirements of the bitline contacts process. The process window could be expanded and both throughput and yield could be improved.

Furthermore, the present invention discloses a method for making DRAM by which a thick oxide layer is deposited on the peripheral circuit to the extent that the thick oxide layer is almost as high as the lower-plate in order to solve the problems of step height and poor coating at the interface between the peripheral circuit and cell arrays.

To avoid the current leakage between the lower-plate and the silicon wafer substrate, the present invention discloses a method by which a lightly doped polysilicon layer is deposited before depositing the lower-plate.

The present invention will be elucidated with reference to the accompanying Drawings which, however, are being presented for illustrative purpose.

DETAILED DESCRIPTION OF THE PREFERRED EMBODIMENTS

Figure 1:
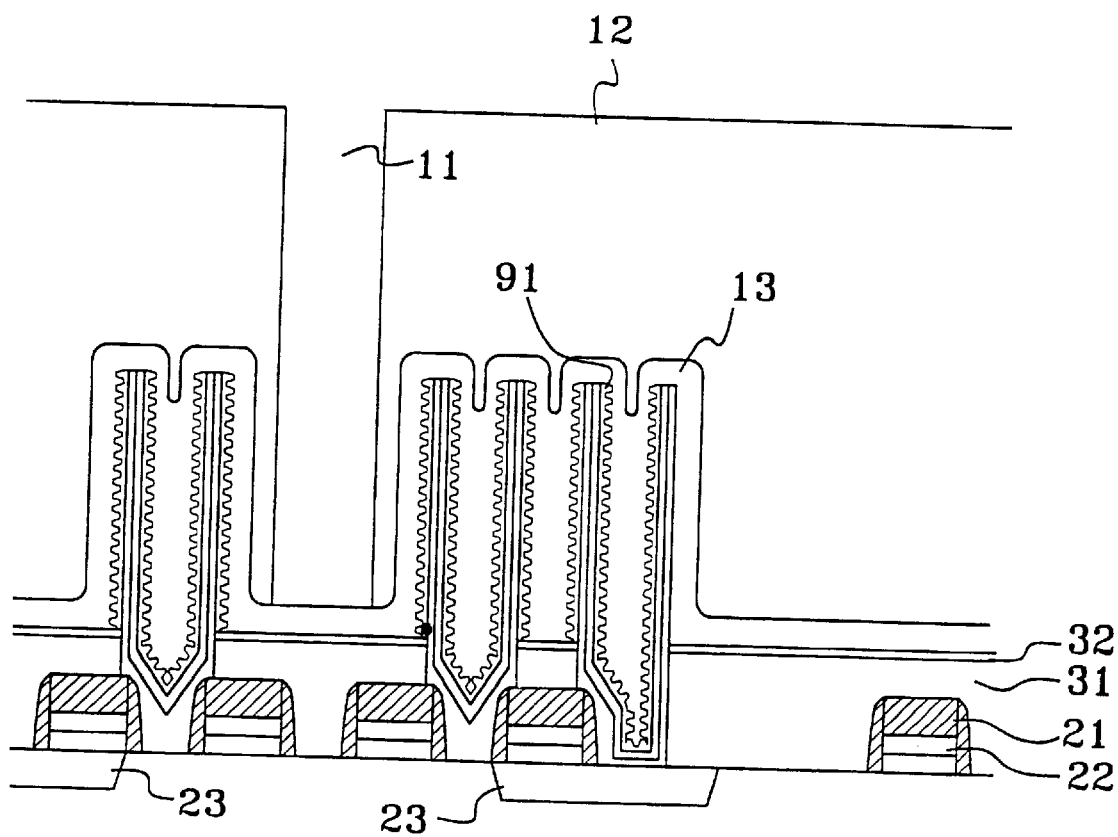
FIG. 1 depicts the structure of the conventional capacitor-under-bitline DRAM.
Figure 2A:
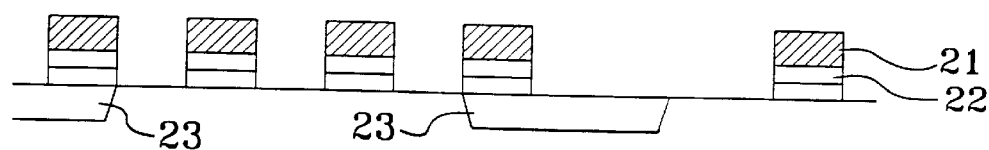
FIG. 2a depicts forming the field effect transistor on silicon wafer semiconductor.

First, field effect transistor is formed on the silicon wafer semiconductor as shown in FIG. 2a. The processes include shallow trench formation, formine filled oxide 23, polycide 22 gate deposition, silicon nitride 21 deposition and proceeding with photolithography exposing and developing, and etching patterning.

Figure 2B:
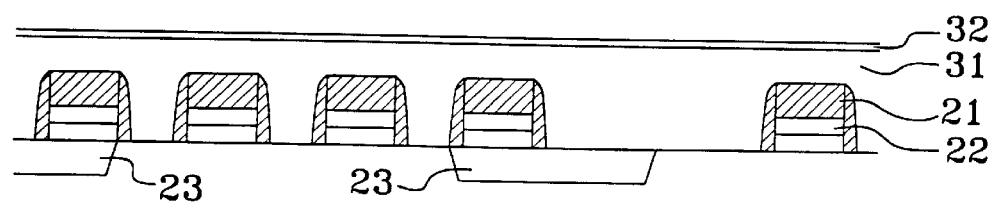
FIG. 2b depicts forming the spacer and oxide deposition.

Then, an insulating layer is formed, as shown in FIG. 2b. According to one of embodiments of the present invention, silicon nitride is deposited and etched first and then forms spacer. Then oxide 31 is deposited as an insulating layer. The oxide 31 is then proceeding with the method of chemical mechanical polishing to form a planar surface. Silicon nitride 32 is then deposited on the oxide 31.

Figure 2C:
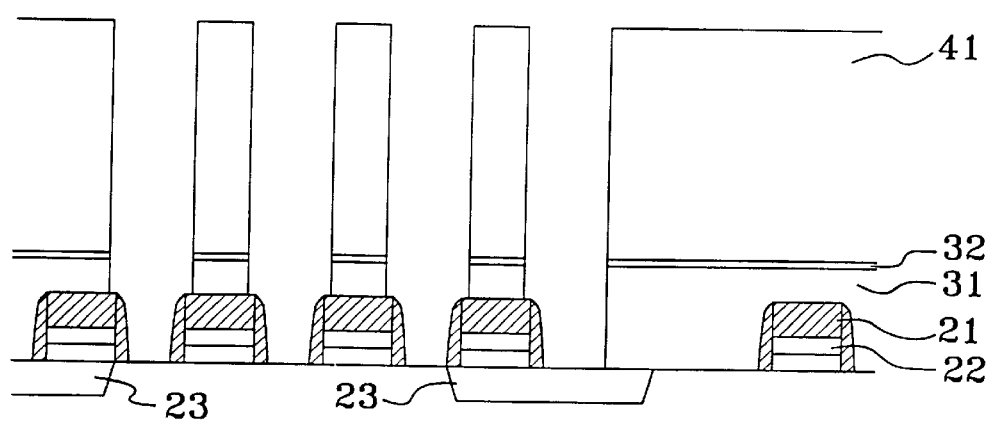
FIG. 2c depicts forming the thick oxide deposition and the contact.

Then a thick oxide is deposited to produce a contact, as shown in FIG. 2c. First, a thick oxide 41 which increases the surface area of the high dielectric constant substance which is deposited later and enhances capacitance at cell arrays area, is deposited. At the peripheral circuit, the thick oxide 41 reduces the step height at the interface between cell arrays and the peripheral circuit. Then a part of oxide is removed using photolithography and etching processes, and a contact is thus produced. The contact includes a bitline contact for connecting a bit-line and contact for contacting the lower-plate and the silicon wafer substrate. The removal of oxide is a process of self-aligned oxide etching. The oxide etching process is highly selective to silicon nitride, that is, there is a gap between etching rates of the oxide and silicon nitride. The unexposed area, i.e., the reticle masked area, is not etched and thus forms oxide 41.

Figure 2D:
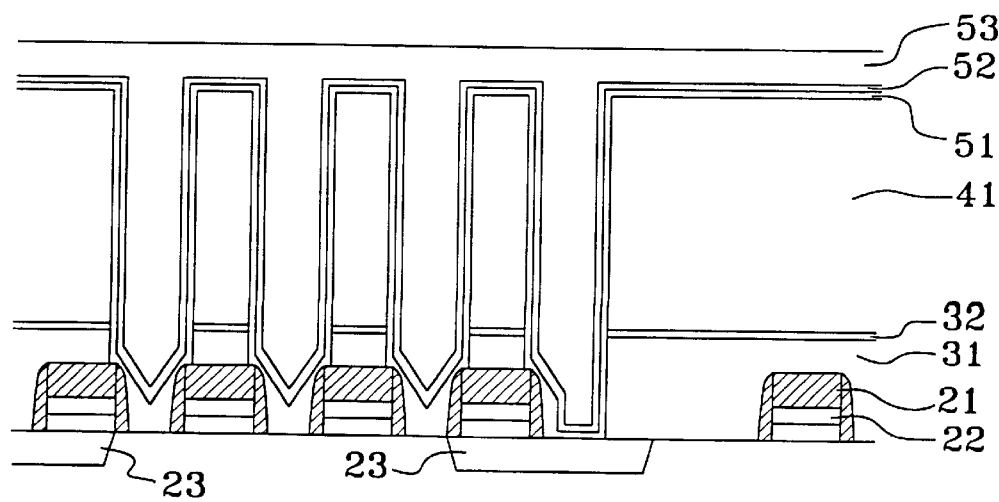
FIG. 2d depicts forming the lower-plate and oxide deposition.

Then lower-plate 52 is deposited, as shown in FIG. 2d. The lower-plate 52 is formed by at the cell array area depositing the contact formed in previous process to form a three-dimensional structure. The structure increases the surface area of the high dielectric constant substance deposited in the following procedure and enhances capacitance. However, it is the vertical and three-dimensional structure that increases the depth of the bitline contacts and keeps the bit-line far away from the transistor. This makes the producing processes of the bitline contacts difficult in photolithography and etching and it is also the problem exists in the prior art. On the other hand, the lower-plate 52 contacts the silicon wafer substrate at the bottom of cell array area and is deposited on the thick oxide 41 at the peripheral area. However the lower-plate 52 depositing on the thick oxide 41 at the peripheral area will be removed in proceeding procedures. The material of the lower-plate 52 could be polysilicon or titanium/titanium nitride. Furthermore, the bottom of the metal titanium, that is, lower-plate 52 contacts the silicon wafer substrate. The contact interface of titanium and the silicon wafer substrate would cause current leakage when the temperature is raised at later processes. The temperature may be raised as high as 700° C. To avoid the current leakage, the present invention discloses the deposition of a lightly doped polysilicon 51 which is one of the characteristics of the present invention.

Oxide 53 is then deposited on the lower-plate 52, as shown in FIG. 2d. The contact is filled with oxide. Especially the bitline contacts are filled with oxide to form an oxide plug. The object of the oxide plug is to avoid high dielectric constant substance depositing into the bitline contacts. The other object of the oxide plug is to lower the photoresist developing depth and to lower the photoresist aspect ratio by which problems such as poor developing could be solved.

Figure 2E:
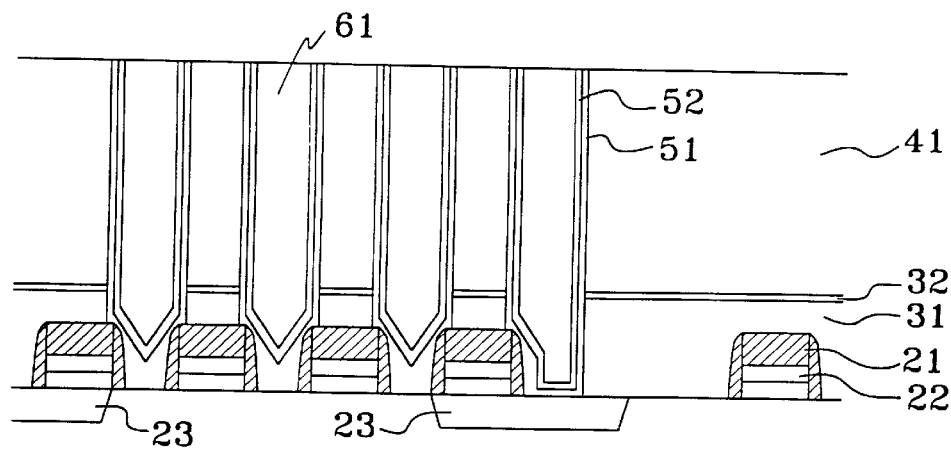
FIG. 2e depicts the removal of oxide and the planar part of lower-plate.

The oxide and the planar part of the lower-plate should be removed, as shown in FIG. 2e. The oxide and the planar part of the lower-plate could be removed by etching or using the method of chemical mechanical polishing. The planar part of the lower-plate should be removed because the peripheral circuit area does not need the lower-plate and the contact could not be connected with each other through the lower-plate.

Figure 2F:
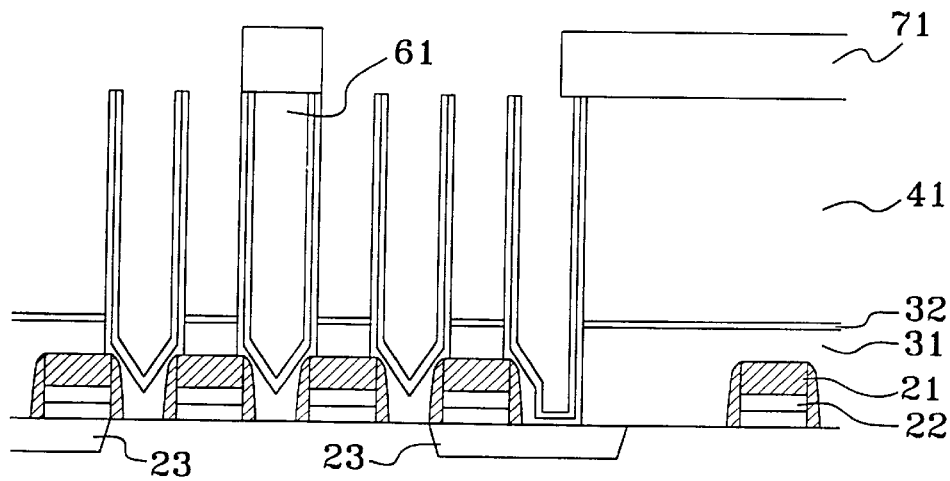
FIG. 2f depicts forming the oxide plug.
Figure 2G:
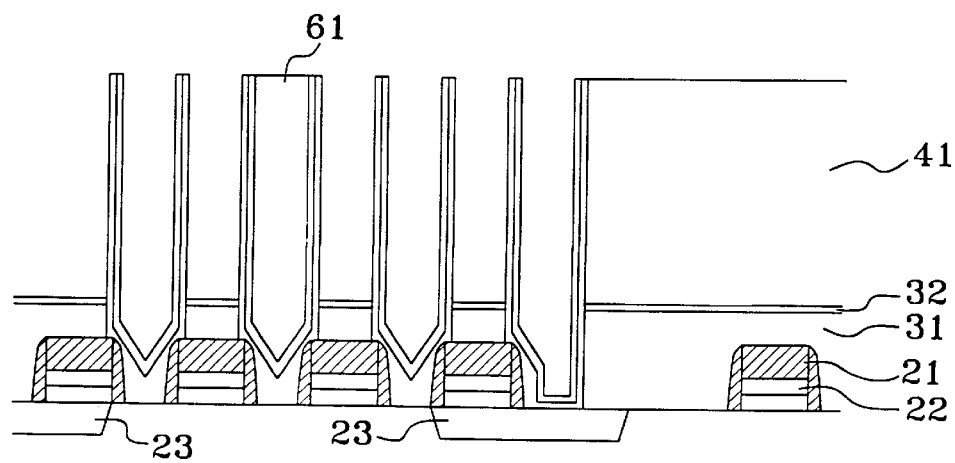
FIG. 2g depicts the photoresist removal.

Then the oxide plug 61 is provided, as shown in FIG. 2f. The oxide plug 61 reflects the main characteristic of the present invention. The contacts are divided into photoresist masking area and unmasking area by using photolithography techniques; especially the bitline contacts and the peripheral circuit area are masked. The unmasked area is then developed and etched, by which the oxide is removed. The etching process could proceed by hydrogen fluoride vapors or wet oxide etching. The unexposed photoresist 71 which is not removed and should be then removed. After removal of the unexposed photoresist 71, see FIG. 2g and the oxide plug 61 is thus formed.

The formation of the oxide plug 61 is the main step of the present invention to solve the problems in existing conventional methods of producing bitline contacts. The oxide plug 61 is helpful in the processes because the depth of developing and etching is not required to reach the bottom of the bitline contacts. The developing and etching are enough as long as the top of the oxide plug 61 is reached. This lowers the photoresist aspect ratio in large scale and helps much to the producing processes. On the other hand, the formation of the oxide plug 61 makes the upper-plate deposited in the following steps to form a planar surface and thus helps the memory to possess better electric performances.

Figure 2H:
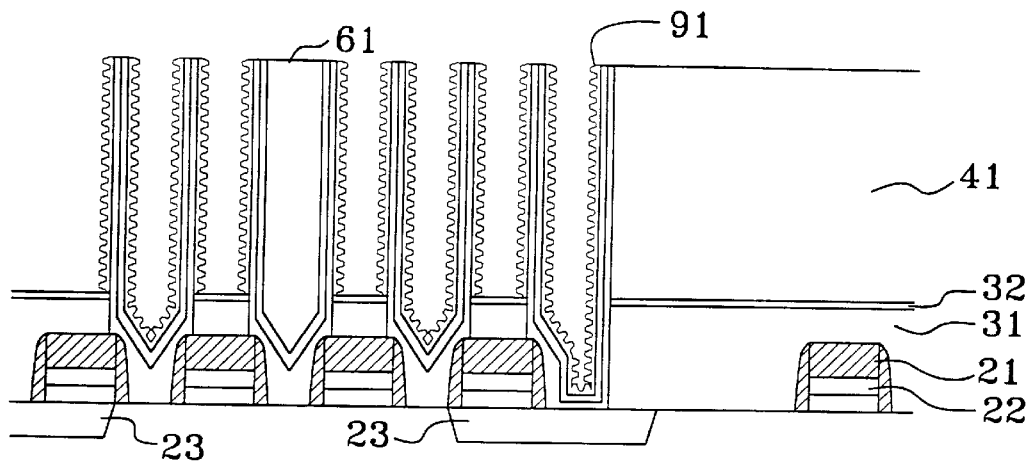
FIG. 2h depicts the deposition of the high dielectric constant substance.

The high dielectric constant substance 91 is then deposited, as shown in FIG. 2h. The high dielectric constant substance 91 is deposited on the lower-plate. In one embodiment of the present invention, polysilicon is selectively deposited onto the conductive layer to form a hemi-sphere grain (HSG). Then a high dielectric constant substance, such as NO, $Ta_2O_5$ or BST, is deposited. The hemi-sphere grain and the high dielectric constant substance are deposited on the wall of the contact and are used for storing current signals and insulating the upper-plate and the lower-plate.

Figure 2I:
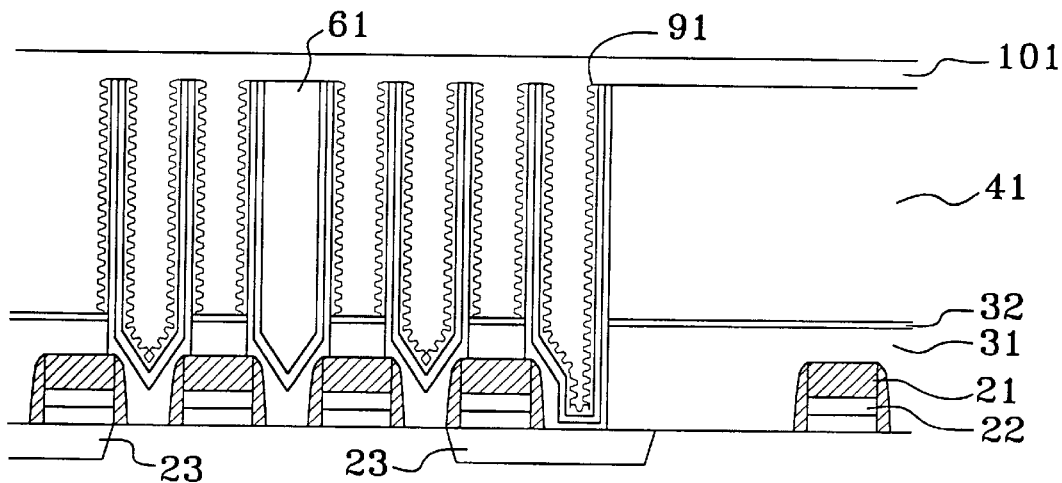
FIG. 2i depicts forming the upper-plate deposition.

The upper-plate 101 is then deposited, as shown in FIG. 2i. In this step, polysilicon or titanium/titanium nitride is in-situ deposited as an upper-plate. The upper-plate is thus deposited to form a more planar surface.

Figure 2J:
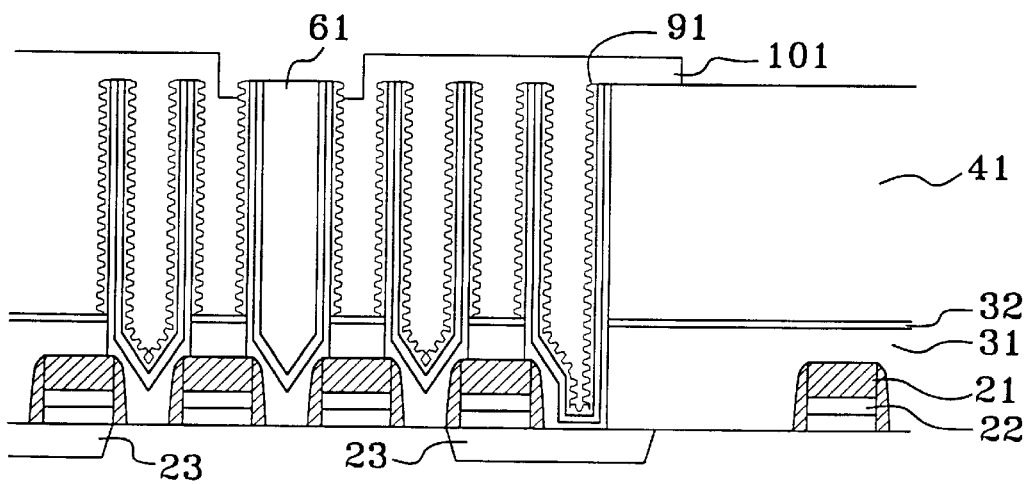
FIG. 2j depicts the upper-plate forming an opening broader than the contact at the top of the lower-plate neighboring the bitline contacts.

The bitline contacts are then produced, as shown in FIG. 2j. First, the upper-plate deposited above the oxide plug 61 by photolithography and etching techniques is removed. This process makes the upper-plate form an opening broader than the contact at the top of the lower-plate neighboring the bitline contacts Not only does the opening insulate the bitline contacts from the upper-plate 101 but also make the photolithography and etching processes of bitline contacts easier to proceed.

The oxide in the plug is then removed by etching to form an empty bitline contacts when the broader opening of the upper-plate neighboring the bitline contacts forms. The etching of conventional bitline contacts requires coating a layer of photoresist to proceed to exposing, developing and etching. The thickness of the photoresist, from photoresist surface to the bottom of the bitline contacts, includes the height of the lower-plate which is a vertical and three-dimensional structure and the height of the photoresist itself for resisting etching. The thickness of the photoresist is almost up to 2 $\mu$m. For a narrow bitline contact, such as 0.25 $\mu$m, the thickness of the photoresist makes photoresist exposing and developing processes hard to proceed. The present invention uses an oxide plug in producing bitline contacts by which the depths of exposing and developing are as low as half of the conventional depth. This is because the depth of exposing and developing of the present invention does not include the height of the lower-plate which is a vertical and three-dimensional structure. This releases in large scale the difficulties in producing bitline contacts.

The produced DRAM is characterized in that the upper-plate is a planar surface and an opening broader than the bitline contact is formed at the top of the lower-plate neighboring the bitline contacts. This facilitates further process of photolithography and etching for bitline contacts. Furthermore, a thick oxide is deposited in the peripheral circuit area. The height of the thick oxide is as high as the lower-plate by which the step height could be reduced.

Figure 2K:
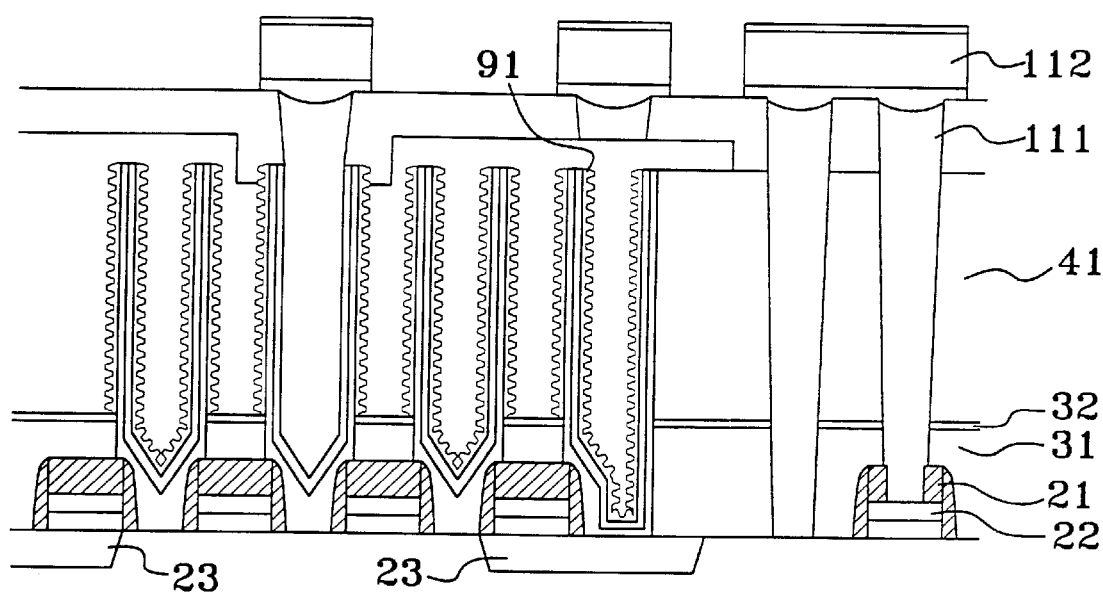
FIG. 2k depicts procedures of etching, removing oxide in the plug, depositing barrier metal, tungsten deposition and etching back, and patterning metal lines.

The deposition and etching of the multi-level contact and metal could proceed based on the above memory and its producing method, as shown in FIG. 2k. Conventional processes could proceed to produce the memory, such as deposition and etching-back of barrier metal and tungsten to form a tungsten plug 111, deposition and patterning of metal layer to form metal lines 112.

This invention is not limited to the example described hereinabove. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A DRAM with an oxide plug in bitline contact, in which each memory cell comprises:
   a transistor, formed on a silicon wafer substrate;
   a bitline contact, having a bottom connecting the silicon wafer substrate to connect a source region of the transistor, and an inner part connecting a bitline; and
   a capacitor, comprising:
      a lower-plate, which is made with Ti or TiN, standing above the transistor and further comprising a selective hemi-sphere grain of lightly doped polysilicon;
      a high dielectric constant substance, which is deposited on the lower-plate; and
      an upper-plate, isolated from the lower-plate by the high dielectric constant substance, having a planar surface and an opening broader than the bitline contact at a top portion of the lower-plate neighboring the bitline contact, wherein the upper-plate is isolated from the bitline contact.

2. The DRAM of claim 1, in which the lower-plate stands above the transistor and forms a vertical and three-dimensional structure.

3. The DRAM of claim 2, in which the planar surface of the upper-plate is higher than the top of the vertical and three-dimensional structure of the lower-plate.

4. The DRAM of claim 1, in which a thick oxide is formed on a peripheral circuit to increase the height of the peripheral circuit and avoid forming a step height between a capacitor and a step circuit area.

5. A DRAM with an oxide plug in bitline contact, in which each memory cell comprises:
   a transistor, formed on a silicon wafer substrate;
   a bitline contact, having a bottom connecting the silicon wafer substrate to connect a source region of the transistor, and an inner part connecting a bitline; and
   a capacitor, comprising:
      a lower-plate, which is made with polysilicon, standing above the transistor and further comprising a selective hemisphere grain of lightly doped polysilicon;
      a high dielectric constant substance, which is deposited on the lower-plate; and
      an upper-plate, isolated from the lower-plate by the high dielectric constant substance, having a planar surface and an opening broader than the bitline contact at a top portion of the lower-plate neighboring the bitline contact, wherein the upper-plate is isolated from the bitline contact.

6. The DRAM of claim 5, in which the lower-plate stands above the transistor and forms a vertical and three-dimensional structure.

7. The DRAM of claim 5, in which the planar surface of the upper-plate is higher than the top of the vertical and three-dimensional structure of the lower-plate.

8. The DRAM of claim 5, in which the thick oxide is formed on the peripheral circuit to increase the height of the peripheral circuit and avoid forming a step height.

* * * * *